US012689349B2

(12) United States Patent
Kuroyanagi

(10) Patent No.: US 12,689,349 B2
(45) Date of Patent: Jul. 21, 2026

(54) ACOUSTIC WAVE FILTER AND RADIO FREQUENCY MODULE

(71) Applicant: Murata Manufacturing Co., Ltd., Nagaokakyo (JP)

(72) Inventor: Takuma Kuroyanagi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 104 days.

(21) Appl. No.: 18/940,697

(22) Filed: Nov. 7, 2024

(65) Prior Publication Data

US 2025/0293659 A1 Sep. 18, 2025

(30) Foreign Application Priority Data

Mar. 12, 2024 (JP) ................................. 2024-038160

(51) Int. Cl.
| | |
|---|---|
| *H03H 9/02* | (2006.01) |
| *H03H 9/00* | (2006.01) |
| *H03H 9/05* | (2006.01) |
| *H03H 9/56* | (2006.01) |
| *H03H 9/64* | (2006.01) |

(52) U.S. Cl.
CPC ...... *H03H 9/02125* (2013.01); *H03H 9/0009* (2013.01); *H03H 9/0014* (2013.01); *H03H 9/02913* (2013.01); *H03H 9/0523* (2013.01); *H03H 9/059* (2013.01); *H03H 9/568* (2013.01); *H03H 9/6483* (2013.01)

(58) Field of Classification Search
CPC ............. H03H 9/02125; H03H 9/0009; H03H 9/0014; H03H 9/02913; H03H 9/0523; H03H 9/0542; H03H 9/059; H03H 9/1071; H03H 9/568; H03H 9/6483; H03H 9/725
See application file for complete search history.

(56) References Cited

U.S. PATENT DOCUMENTS

| | | | | |
|---|---|---|---|---|
| RE43,957 E | * | 2/2013 | Nagai | H03H 9/725 |
| | | | | 333/202 |
| 10,840,877 B2 | * | 11/2020 | Takamine | H03H 9/725 |

(Continued)

FOREIGN PATENT DOCUMENTS

| | | | | |
|---|---|---|---|---|
| CN | 116418312 A | * | 7/2023 | ............. H03H 9/725 |
| JP | H10-107471 A | | 4/1998 | |
| WO | 2022038887 A1 | | 2/2022 | |

*Primary Examiner* — Quan Tra
(74) *Attorney, Agent, or Firm* — XSENSUS LLP

(57) ABSTRACT

An acoustic wave filter includes a piezoelectric substrate, series-arm resonators disposed at the piezoelectric substrate, an external connection terminal disposed at the piezoelectric substrate and connected to an antenna connection terminal, an external connection terminal disposed at the piezoelectric substrate and connected to an amplifier, a wire disposed at the piezoelectric substrate and electrically connecting the external connection terminal to the series-arm resonator, a wire disposed at the piezoelectric substrate and electrically connecting the external connection terminal to the series-arm resonator, and a shield that covers a part of a side surface of the piezoelectric substrate, wherein the shield covers at least a part of an area of the side surface of the piezoelectric substrate opposing the wire without covering an area of the side surface of the piezoelectric substrate opposing the wire.

20 Claims, 12 Drawing Sheets

(56) References Cited

U.S. PATENT DOCUMENTS

| | | | |
|---|---|---|---|
| 2004/0116098 A1* | 6/2004 | Ochii | H03H 9/725 |
| | | | 455/333 |
| 2005/0264375 A1* | 12/2005 | Ikuta | H03H 9/725 |
| | | | 333/195 |
| 2015/0137909 A1* | 5/2015 | Okuda | H03H 9/6483 |
| | | | 333/133 |
| 2017/0111078 A1* | 4/2017 | Onodera | H03H 9/0566 |
| 2020/0295737 A1* | 9/2020 | Takata | H03H 9/725 |
| 2023/0121885 A1* | 4/2023 | Matsumoto | H03H 9/02086 |
| | | | 333/124 |
| 2023/0189429 A1 | 6/2023 | Nomura et al. | |
| 2023/0420819 A1* | 12/2023 | Nihei | H01P 1/20345 |

* cited by examiner

ACOUSTIC WAVE FILTER AND RADIO FREQUENCY MODULE

CROSS-REFERENCE TO RELATED APPLICATION

This application claims priority to Japanese Patent Application No. JP 2024-038160 filed on Mar. 12, 2024. The entire contents of the above-identified application, including the specifications, drawings and claims, are incorporated herein by reference in their entirety.

BACKGROUND OF THE INVENTION

1. Field of the Invention

The present disclosure relates to an acoustic wave filter and a radio frequency module.

2. Description of the Related Art

Japanese Unexamined Patent Application Publication No. 10-107471 discloses forming a hole in a ceiling portion of a shield case that shields a radio frequency filter. In this structure, capacitive coupling and/or inductive coupling between the radio frequency filter and the shield case is reduced, and deterioration of characteristics of the radio frequency filter is reduced.

SUMMARY OF THE INVENTION

The existing technology above, however, may fail to reduce deterioration of the attenuation characteristic of the shield while reducing deterioration of the transmission characteristic caused by coupling between the acoustic wave filter and other components.

Accordingly, it is a feature of the present disclosure to provide an acoustic wave filter and a radio frequency module that can reduce deterioration of the transmission characteristic and the attenuation characteristic.

An acoustic wave filter according to an aspect of the present disclosure includes a first substrate; a first series-arm resonator and a second series-arm resonator disposed at the first substrate; a first external connection terminal disposed at the first substrate and connected to an antenna connection terminal; a second external connection terminal disposed at the first substrate and connected to an amplifier; a first wire disposed at the first substrate and electrically connecting the first external connection terminal to the first series-arm resonator; a second wire disposed at the first substrate and electrically connecting the second external connection terminal to the second series-arm resonator; and a shield that covers a part of a side surface of the first substrate, wherein the shield covers at least a part of a second area of a side surface of the first substrate opposing the second wire without covering a first area of the side surface of the first substrate opposing the first wire.

An acoustic wave filter according to an aspect of the present disclosure includes a first substrate and a second substrate; a first series-arm resonator disposed at the first substrate; a second series-arm resonator disposed at the second substrate; a first external connection terminal disposed at the first substrate and connected to an antenna connection terminal; a second external connection terminal disposed at the second substrate and connected to an amplifier; a third external connection terminal disposed at the first substrate and connected to the second substrate; a fourth external connection terminal disposed at the second substrate and connected to the third external connection terminal; and a shield that covers at least a part of a side surface of the second substrate, wherein a side surface of the first substrate is not covered with the shield.

In an acoustic wave filter according to the present disclosure, deterioration of the transmission characteristic and the attenuation characteristic can be reduced.

DESCRIPTION OF THE PREFERRED EMBODIMENTS

Figure 1:
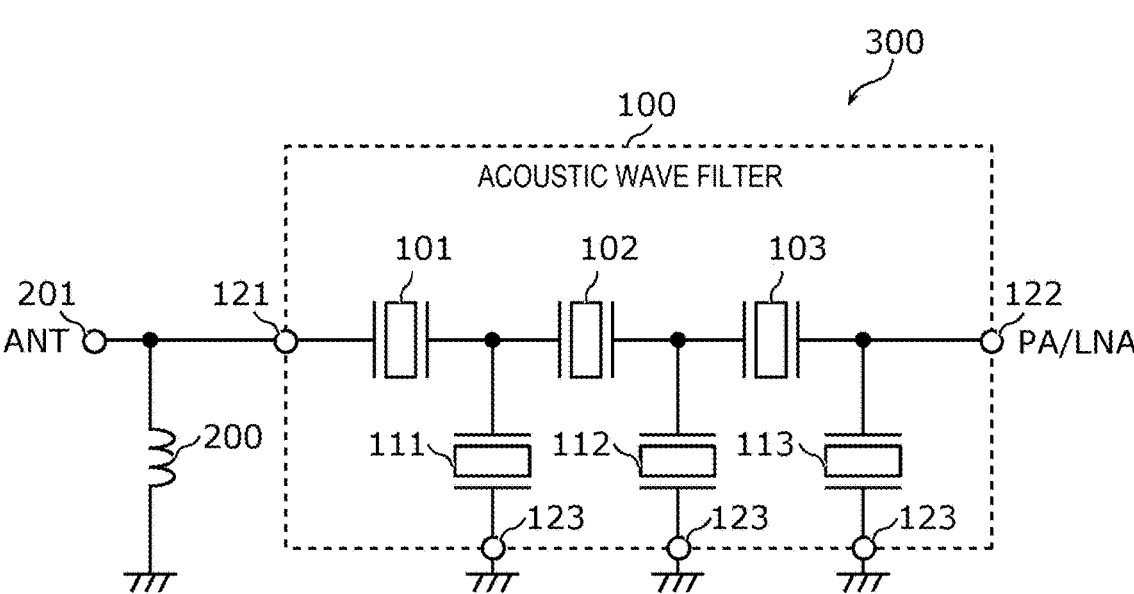
FIG. 1 is a circuit configuration diagram of a radio frequency module according to a first embodiment.

Hereafter, embodiments of the present disclosure are described in detail with reference to the drawings. The embodiments described below each illustrate a general or specific example. The numerical values, shapes, materials, components, and the arrangement of and connection between the components indicated in the embodiments below are mere examples, and are not intended to limit the present disclosure.

The drawings are schematic diagrams involving, as appropriate, accentuation, elimination, or adjustment in ratio to illustrate the present disclosure, and not necessarily precisely drawn. Thus, the drawings may differ from the actual ones in terms of shapes, positional relationships, and ratios. In each drawing, substantially the same components are denoted with the same reference sign, and redundant description may be omitted or simplified.

In each drawing described below, an x-axis and a y-axis are axes orthogonal to each other on a plane parallel to the main surface of a substrate. More specifically, assuming a substrate is rectangular in plan view, the x-axis is parallel to a first edge of a module substrate, and the y-axis is parallel to a second edge of the substrate orthogonal to the first edge. A z-axis is an axis perpendicular to the main surface of a substrate, a positive direction of the z-axis indicates upward, and a negative direction of the z-axis indicates downward.

In the description below, "being connected" includes, in addition to a case where components are directly connected to each other with a connection terminal and/or a wire conductor, a case where components are electrically connected to each other with another circuit element. The expression that "C is connected between A and B" indicates a case where one end of C is connected to A, another end of C is connected to B, and C is arranged in series on a path connecting A and B. The expression of "a path connecting A and B" indicates a path formed from a conductor that electrically connects A to B.

The expression of "a terminal" indicates a point where a conductor among components ends. When a conductor among components has sufficiently low impedance, a terminal is construed as any point on the conductor among the components or the entire conductor, instead of a single point.

The expression of "a filter pass band" is a portion of a frequency spectrum transmitted by a filter, and is defined as a frequency band in which output power does not attenuate more than or equal to 3 dB from the maximum output power. Thus, a high frequency end and a low frequency end of a pass band of a band pass filter are specified as a higher frequency and a lower frequency at two points where output power attenuates 3 dB from the maximum output power.

The expression of "a transmission band" indicates a frequency band used by a communication device for transmission. The expression of "a reception band" indicates a frequency band used by a communication device for reception. For example, in a frequency division duplex (FDD) band, different frequency bands (for example, an uplink band and a downlink band) are used as a transmission band and a reception band. For example, in a time division duplex (TDD) band, the same frequency band is used for the transmission band and the reception band.

The expression of "being simultaneously capable of communication" indicates a situation where multiple band signals can be simultaneously transmitted, received, or transmitted and received. A band combination that is simultaneously capable of communication is defined in advance by, for example, a standardization organization (for example, the 3rd generation partnership project (3GPP, registered trademark) and the Institute of Electrical and Electronics Engineers (IEEE). Examples of simultaneous communication include carrier aggregation (CA), E-UTRAN New Radio-Dual Connectivity (EN-DC), New Radio-Dual Connectivity (NR-DC), and New Radio E-UTRAN-Dual Connectivity (NE-DC).

The expression that "a component is disposed at a substrate" includes a case where a component is disposed on a main surface of a substrate and a case where a component is disposed in a substrate. The expression that "a component is disposed on a main surface of a substrate" includes, in addition to a case where a component is disposed in contact with the main surface of the substrate, a case where a component is disposed above the main surface without being in contact with the main surface (for example, a case where a component is laminated on another component disposed in contact with the main surface). The expression that "a component is disposed on a main surface of a substrate" may include a case where a component is disposed in a recess formed in the main surface. The expression that "a component is disposed in a substrate" includes, in addition to a case where a component is encapsulated in a module substrate, a case where the entirety of the component is disposed between both main surfaces of a substrate while a part of the component is left without being covered with the substrate, and a case where only a part of the component is disposed in the substrate.

The expression of "a shield covering a side surface of a substrate" indicates a state where, assuming a side surface of a substrate is viewed in a direction normal to the side surface, the side surface is blocked by a shield. Thus, the shield does not necessarily have to be in contact with the side surface.

The expression of "an area on the side surface of the substrate opposing a component (for example, a wire or a resonator)" indicates an area on one of two parallel side surfaces of a substrate located closer to a component in plan view, and an area on a side surface of the substrate obtained by extending, in a direction normal to the main surface of the substrate (a z-direction), an area obtained by orthographically projecting the component on a plane parallel to the side surface.

Terms indicating the relations between components such as "parallel" and "perpendicular", terms indicating the shapes of components such as "rectangular", and numerical ranges do not only indicate the strict meanings, but also indicate substantially equivalent ranges, for example, allowable tolerances of about several percent.

First Embodiment

A first embodiment is described. A radio frequency module 300 including an acoustic wave filter 100 according to the present embodiment is usable in a communication device used to provide wireless communications. For example, the radio frequency module 300 is usable in user equipment (UE) in a cellular network (also referred to as a mobile network) such as a mobile phone, a smartphone, a tablet computer, or a wearable device. In another example, the radio frequency module 300 is usable in a communication device used to provide wireless communications to an Internet of Things (IoT) sensor device, a medical/healthcare device, a vehicle, an unmanned aerial vehicle (UAV) (or a so-called drone), or an automated guided vehicle (AGV). In another example, the radio frequency module 300 is usable in a communication device used to provide wireless communications at a wireless access point or a wireless hot spot.

The circuit configuration of the radio frequency module 300 according to the present embodiment is described with reference to FIG. 1. FIG. 1 is a circuit configuration diagram of the radio frequency module 300 according to the present embodiment.

FIG. 1 illustrates an exemplary circuit configuration, and the radio frequency module 300 and the acoustic wave filter 100 may be implemented with any type of various circuit implementation and circuit technologies. Thus, the description of the radio frequency module 300 and the acoustic wave filter 100 provided below is not to be construed as being limiting.

1.1 Circuit Configuration of Radio Frequency Module 300

The radio frequency module 300 includes an acoustic wave filter 100, an inductor 200, and an antenna connection terminal 201. The circuit configuration of the acoustic wave filter 100 is described in detail later.

The antenna connection terminal 201 is an external connection terminal of the radio frequency module 300. The antenna connection terminal 201 is connected to an antenna (not illustrated) outside the radio frequency module 300, and connected to the acoustic wave filter 100 in the radio frequency module 300.

The acoustic wave filter 100 is a band pass filter having a pass band including a reception band of a band A. The acoustic wave filter 100 may be a band pass filter having a pass band including a transmission band of the band A. The acoustic wave filter 100 is not limited to a band pass filter. A surface acoustic wave (SAW) filter or a bulk acoustic wave (BAW) filter may be used as an example of the acoustic wave filter 100.

The band A is an example of a first band, which is a frequency band for a communication system built with a radio access technology (RAT). The band A is defined in advance by, for example, a standardization organization (such as 3GPP or IEEE). Examples of a communication system include the 5th generation new radio (5GNR) system, the long term evolution (LTE) system, and the wireless local area network (WLAN) system.

The inductor 200 is connected between a ground and a path connecting the antenna connection terminal 201 and the acoustic wave filter 100. The inductor 200 forms, for example, an impedance matching circuit. The circuit configuration of the impedance matching circuit is not limited to the circuit configuration in FIG. 1. For example, in addition to the inductor 200 or instead of the inductor 200, the impedance matching circuit may include an inductor and/or a capacitor connected between the antenna connection terminal 201 and the acoustic wave filter 100, or include a capacitor connected between a ground and a path connecting the antenna connection terminal 201 and the acoustic wave filter 100.

The radio frequency module 300 may include a power amplifier and/or a low-noise amplifier, or include multiple acoustic wave filters 100.

1.2 Circuit Configuration of Acoustic Wave Filter 100

The circuit configuration of the acoustic wave filter 100 is described now with reference to FIG. 1. The acoustic wave filter 100 includes series-arm resonators 101, 102, and 103, parallel-arm resonators 111, 112, and 113, and external connection terminals 121, 122, and 123.

The external connection terminal 121 is an example of a first external connection terminal. The external connection terminal 121 is connected to the antenna connection terminal 201 outside the acoustic wave filter 100, and connected to the series-arm resonator 101 in the acoustic wave filter 100.

The external connection terminal 122 is an example of a second external connection terminal. The external connection terminal 122 is connected to a power amplifier (not illustrated) and/or a low-noise amplifier (not illustrated) outside the acoustic wave filter 100, and connected to the series-arm resonator 103 in the acoustic wave filter 100.

The external connection terminals 123 are connected to the ground outside the acoustic wave filter 100, and connected to the parallel-arm resonators 111 to 113 in the acoustic wave filter 100.

The series-arm resonators 101 to 103 are connected in series between the external connection terminals 121 and 122. More specifically, the series-arm resonator 101 is an example of a first series-arm resonator, and connected between the external connection terminal 121 and the series-arm resonator 102. The series-arm resonator 102 is connected between the series-arm resonators 101 and 103. The series-arm resonator 103 is an example of a second series-arm resonator, and connected between the series-arm resonator 102 and the external connection terminal 122.

The parallel-arm resonators 111 to 113 are connected in parallel to one another between the ground and a path connecting the external connection terminals 121 and 122. More specifically, the parallel-arm resonator 111 is connected between the path connecting the series-arm resonators 101 and 102 and a corresponding one of the external connection terminals 123. The parallel-arm resonator 112 is connected between the path connecting the series-arm resonators 102 and 103 and a corresponding one of the external connection terminals 123. The parallel-arm resonator 113 is connected between the path connecting the series-arm resonator 103 and the external connection terminal 122 and a corresponding one of the external connection terminals 123.

The number of series-arm resonators and the number of parallel-arm resonators included in the acoustic wave filter 100 are not limited to the numbers of resonators illustrated in FIG. 1. For example, the acoustic wave filter 100 may include one series-arm resonator and one parallel-arm resonator. More specifically, in the acoustic wave filter 100, the first series-arm resonator and the second series-arm resonator may be the same series-arm resonator.

1.3 Implementation Example of Radio Frequency Module 300

Figure 2:
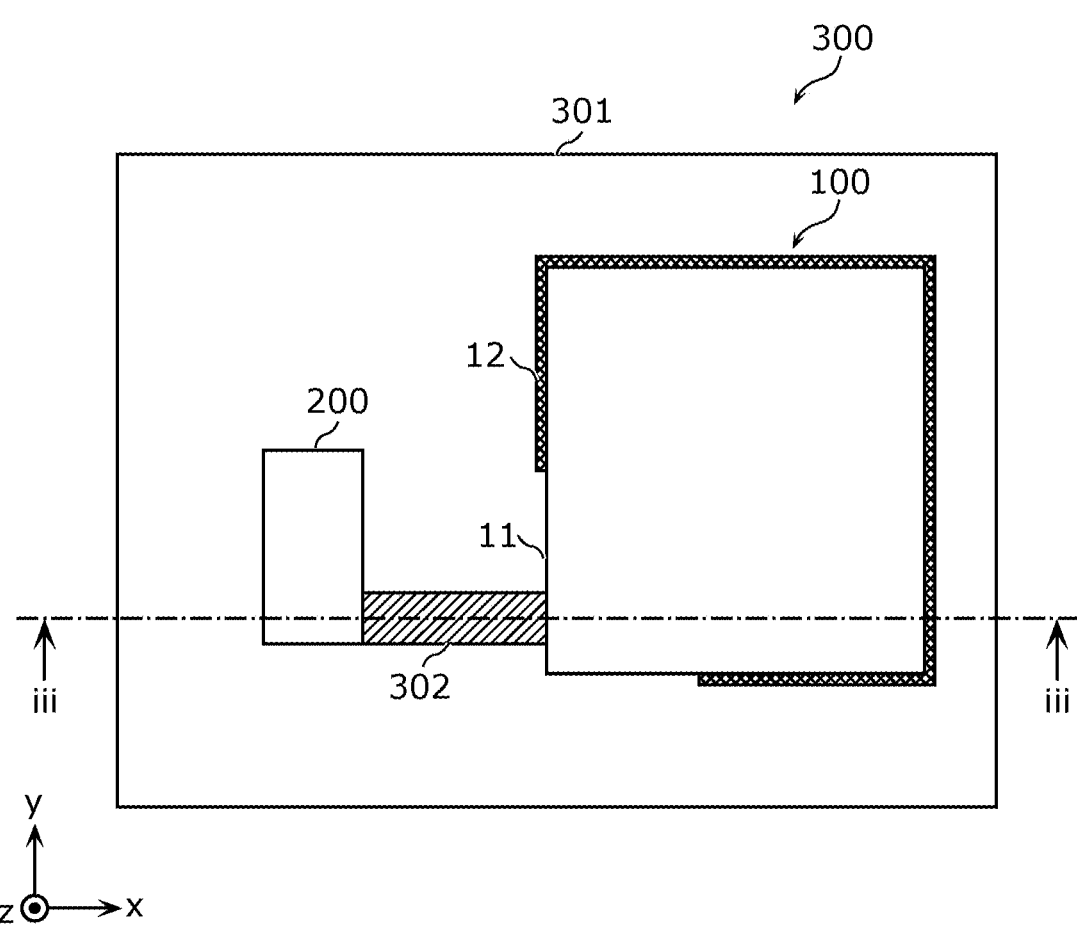
FIG. 2 is a plan view of the radio frequency module according to the first embodiment.
Figure 3:
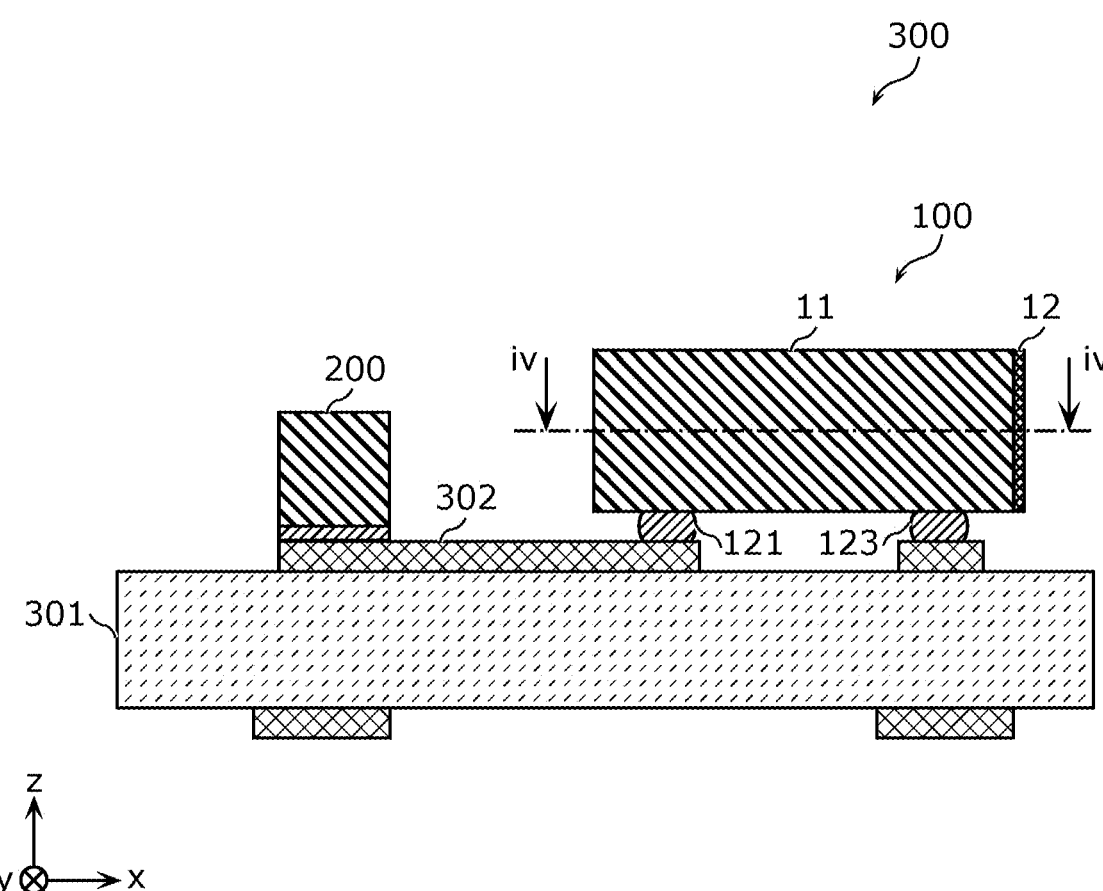
FIG. 3 is a cross-sectional view of the radio frequency module according to the first embodiment.

An implementation example of the radio frequency module 300 is described now with reference to FIG. 2 and FIG. 3. FIG. 2 is a plan view of the radio frequency module 300 according to the present embodiment. FIG. 3 is a cross-sectional view of the radio frequency module 300 according to the present embodiment.

FIG. 2 and FIG. 3 are exemplary drawings. The radio frequency module 300 may be implemented with any type of various circuit implementation and circuit technologies. Thus, the description of the radio frequency module 300 provided below is not to be construed as being limiting.

The radio frequency module 300 includes a module substrate 301, the acoustic wave filter 100, and the inductor 200. The acoustic wave filter 100 and the inductor 200 are disposed on the main surface of the module substrate 301.

The module substrate 301 may be, for example, a low temperature co-fired ceramics (LTCC) substrate or a high temperature co-fired ceramics (HTCC) substrate having a laminated structure of multiple dielectric layers, a substrate with built-in components, a substrate having a redistribution layer (RDL), or a printed circuit board, but is not limited to these.

The acoustic wave filter 100 includes a substrate 11, a shield 12, and the external connection terminals 121 to 123. The external connection terminal 121 is electrically connected to the inductor 200 through a wire 302 on the module substrate 301. The acoustic wave filter 100 is described in detail later with reference to FIG. 4 to FIG. 9.

The inductor 200 is implemented as a chip inductor. A chip inductor indicates a surface mount device (SMD) forming an inductor. The inductor 200 may be implemented in a form other than a chip inductor. For example, the inductor 200 may be implemented by a wire pattern disposed at the module substrate 301.

1.4 Implementation Example of Acoustic Wave Filter 100

Figure 4:
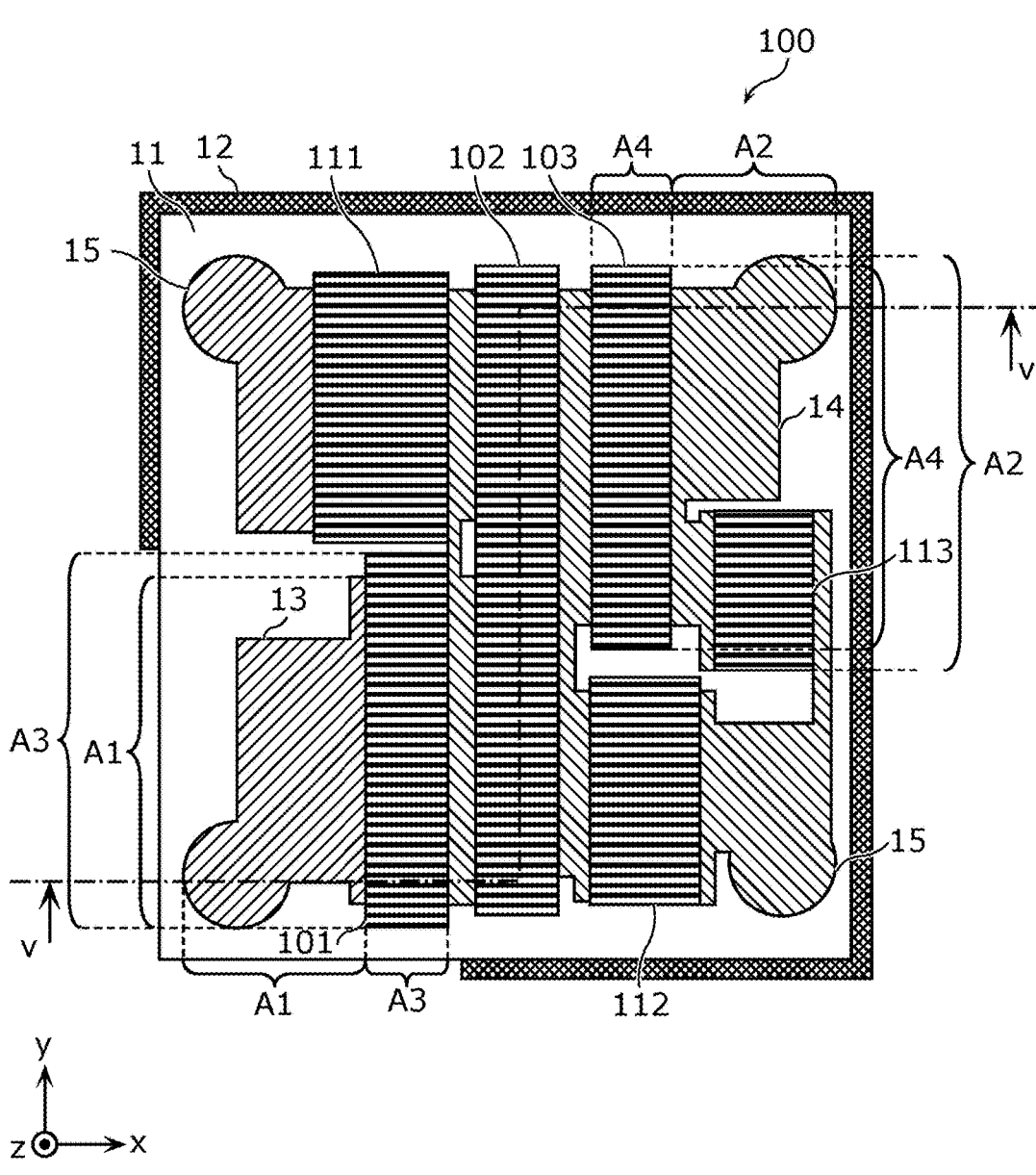
FIG. 4 is a cross-sectional view of an acoustic wave filter according to the first embodiment.
Figure 5:
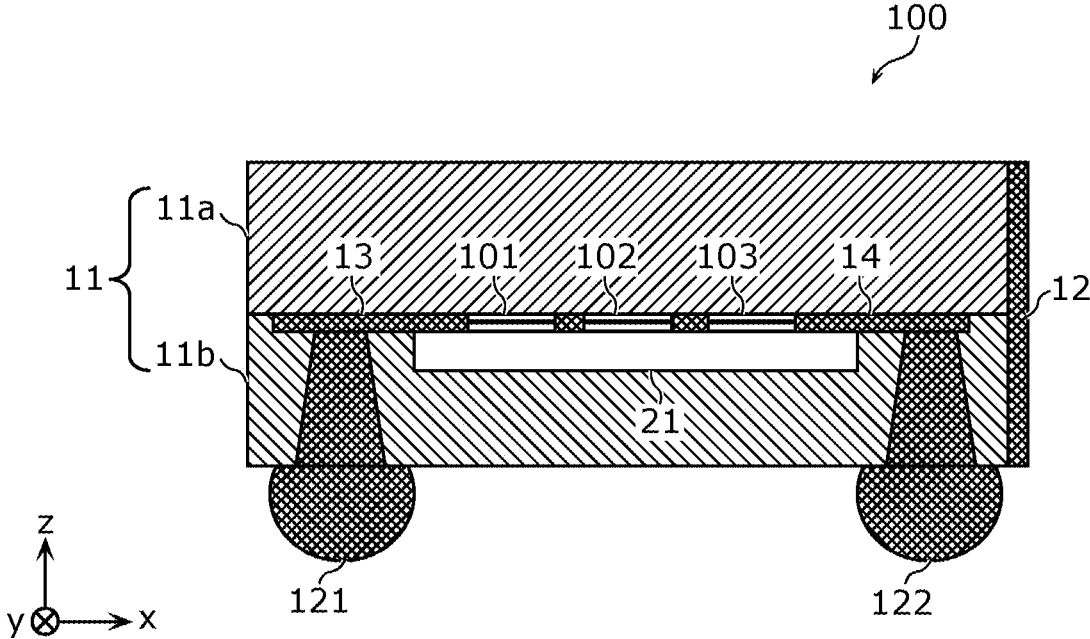
FIG. 5 is a cross-sectional view of the acoustic wave filter according to the first embodiment.
Figure 6:
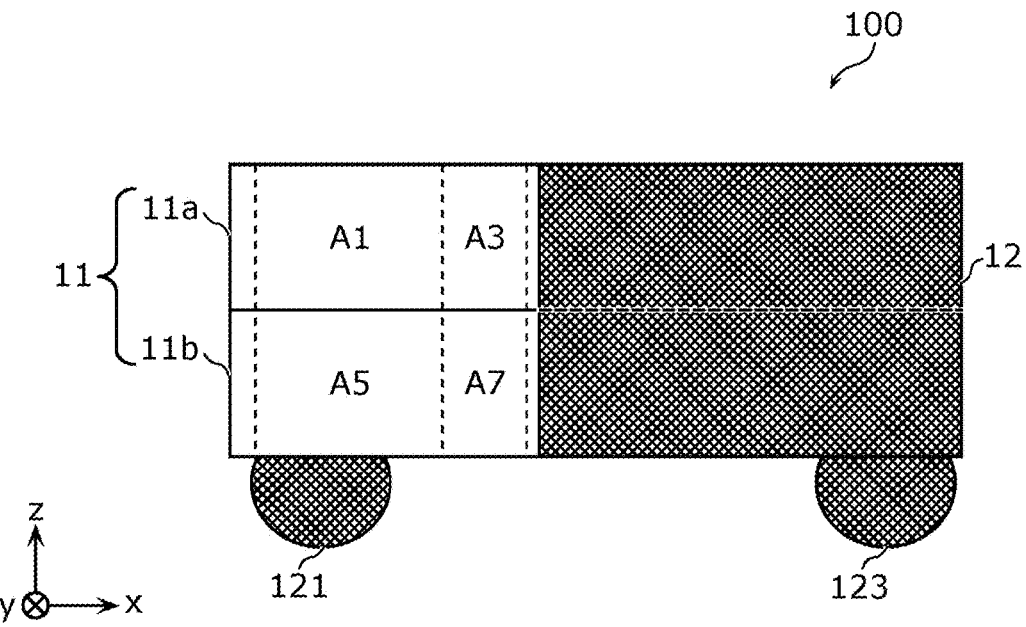
FIG. 6 is a front view of the acoustic wave filter according to the first embodiment.
Figure 7:
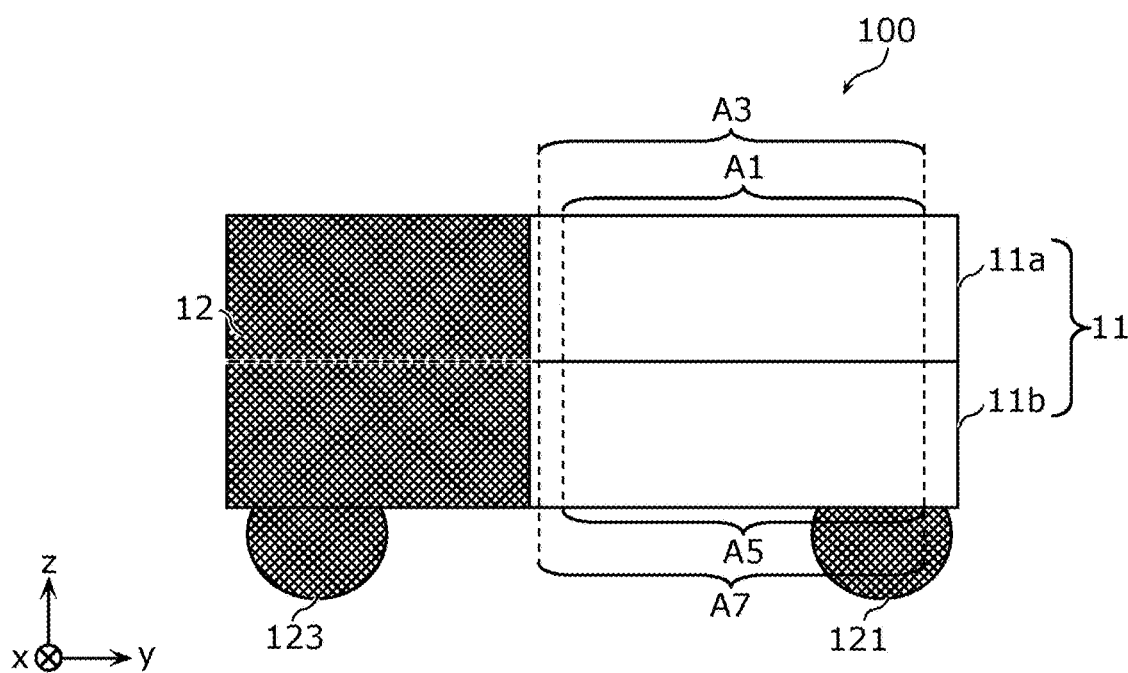
FIG. 7 is a left side view of the acoustic wave filter according to the first embodiment.
Figure 8:
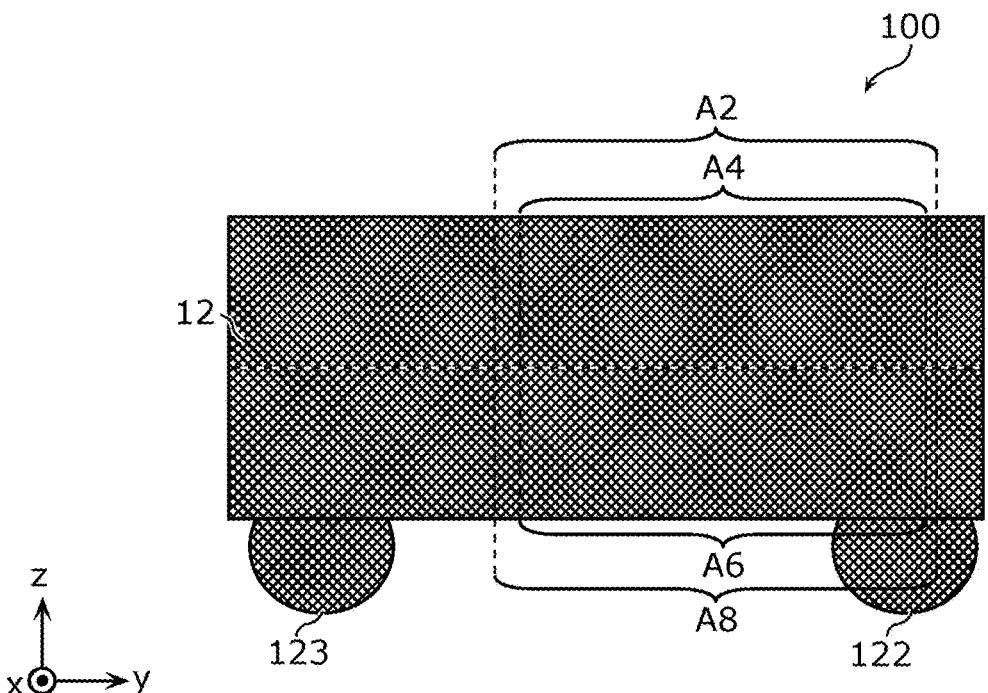
FIG. 8 is a right side view of the acoustic wave filter according to the first embodiment.
Figure 9:
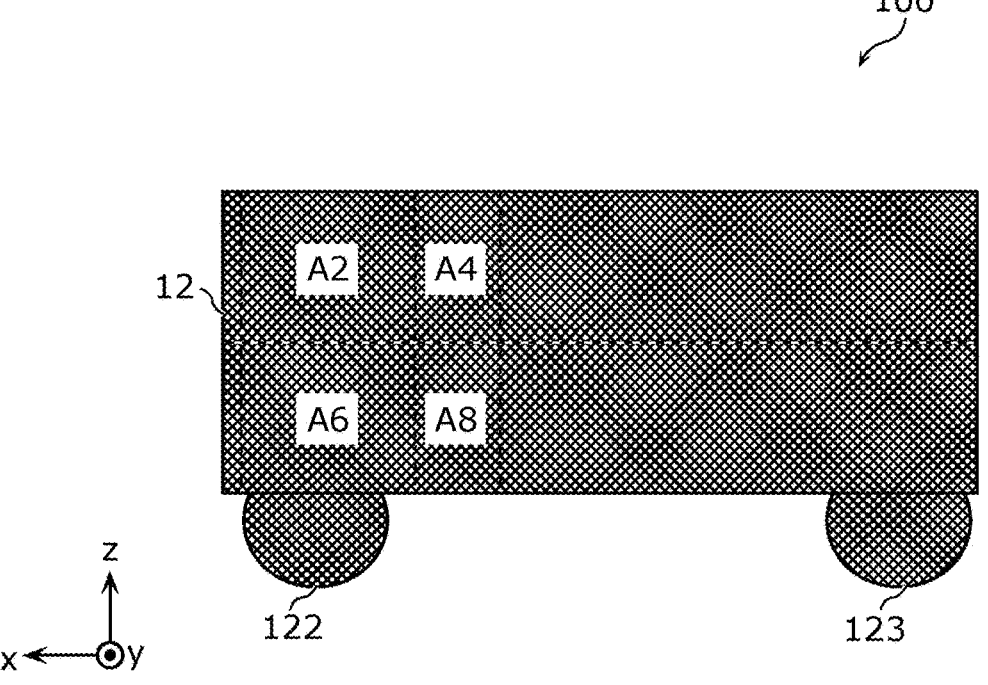
FIG. 9 is a rear view of the acoustic wave filter according to the first embodiment.

An implementation example of the acoustic wave filter 100 is described now with reference to FIG. 4 to FIG. 9. FIG. 4 and FIG. 5 are cross-sectional views of the acoustic wave filter 100 according to the present embodiment. The cross sections of the acoustic wave filter 100 in FIG. 4 and FIG. 5 are cross sections taken along line iv-iv in FIG. 3 and line v-v in FIG. 4. FIG. 6 to FIG. 9 are a front view, a left side view, a right side view, and a rear view of the acoustic wave filter 100 according to the present embodiment.

FIG. 4 to FIG. 9 are exemplary diagrams, and the acoustic wave filter 100 may be implemented with any type of various circuit implementation and circuit technologies.

Thus, the description of the acoustic wave filter 100 provided below is not to be construed as being limiting.

As illustrated in FIG. 5, the substrate 11 includes a piezoelectric substrate 11a and a support substrate 11b.

The piezoelectric substrate 11a is an example of a first substrate, and disposed on the support substrate 11b. The piezoelectric substrate 11a is formed from, for example, piezoelectric ceramics or a piezoelectric single crystal of lithium tantalate (LiTaO₃), lithium niobate (LiNbO₃), aluminium nitride (AlN), or zinc oxide (ZnO). The material of the piezoelectric substrate 11a is not limited to any of these.

The series-arm resonators 101 to 103 and the parallel-arm resonators 111 to 113 are disposed on the piezoelectric substrate 11a. The series-arm resonators 101 to 103 and the parallel-arm resonators 111 to 113 are, for example, inter digital transducer (IDT) electrodes disposed on the surface of the piezoelectric substrate 11a. The IDT electrodes can generate and detect surface acoustic waves.

Wires 13, 14, and 15 are also disposed at the piezoelectric substrate 11a. The wire 13 electrically connects the series-arm resonator 101 to the external connection terminal 121. The wire 14 electrically connects the series-arm resonator 103 to the external connection terminal 122. The wire 15 electrically connects the parallel-arm resonators 111 to 113 to the external connection terminals 123. The wires 13 to 15 may include busbar electrodes of the IDT electrodes.

The support substrate 11b is an example of a second substrate, and supports the piezoelectric substrate 11a. The support substrate 11b is, for example, a silicon substrate, and includes a recess 21 to define a space between the support substrate 11b and the series-arm resonators 101 to 103 and the parallel-arm resonators 111 to 113. Via conductors that electrically connect the wires 13 to 15 and the external connection terminals 121 to 123 are disposed in the support substrate 11b.

The shield 12 is, for example, a metal film formed by sputtering, and is connected to the ground. The shield 12 can reduce capacitive coupling (electric field coupling) and/or inductive coupling (magnetic field coupling) between components in the acoustic wave filter 100 and components outside the acoustic wave filter 100.

As illustrated in FIG. 6 to FIG. 9, the shield 12 partially covers the side surfaces of the piezoelectric substrate 11a and the support substrate 11b. More specifically, the shield 12 covers at least areas A2, A4, A6, and A8 of the side surfaces of the piezoelectric substrate 11a and the support substrate 11b without covering at least areas A1, A3, A5, and A7. The shield 12 only has to cover at least a part of the area A2, and does not have to cover the areas A4, A6, and A8. The shield 12 may cover the areas A3, A5, and A7.

The area A1 is an example of a first area, which is an area of the side surface of the piezoelectric substrate 11a opposing the wire 13. The area A2 is an example of a second area, which is an area of the side surface of the piezoelectric substrate 11a opposing the wire 14. The area A3 is an example of a third area, which is an area of the side surface of the piezoelectric substrate 11a opposing the series-arm resonator 101. The area A4 is an example of a fourth area, which is an area of the side surface of the piezoelectric substrate 11a opposing the series-arm resonator 103.

The area A5 is an example of a fifth area, which is an area of the side surface of the support substrate 11b opposing the wire 13. The area A6 is an example of a sixth area, which is an area of the side surface of the support substrate 11b opposing the wire 14. The area A7 is an example of a seventh area, which is an area of the side surface of the support substrate 11b opposing the series-arm resonator 101.

The area A8 is an example of an eighth area, which is an area of the side surface of the support substrate 11b opposing the series-arm resonator 103.

The inductor 200 is located closer to the area A1 than to the area A2, and located closer to the area A3 than to the area A4. The inductor 200 is located closer to the area A5 than to the area A6 and located closer to the area A7 than to the area A8.

The external connection terminals 121 to 123 are disposed at the main surface (the undersurface in FIG. 5) of the support substrate 11b away from the piezoelectric substrate 11a. The external connection terminals 121 to 123 are electrically connected to a ground terminal and an input/output terminal of the module substrate 301. Copper electrodes or solder electrodes are used as examples of the external connection terminals 121 to 123.

1.5 Effects on Parasitic Capacitance Caused by Shield 12

Figure 10:
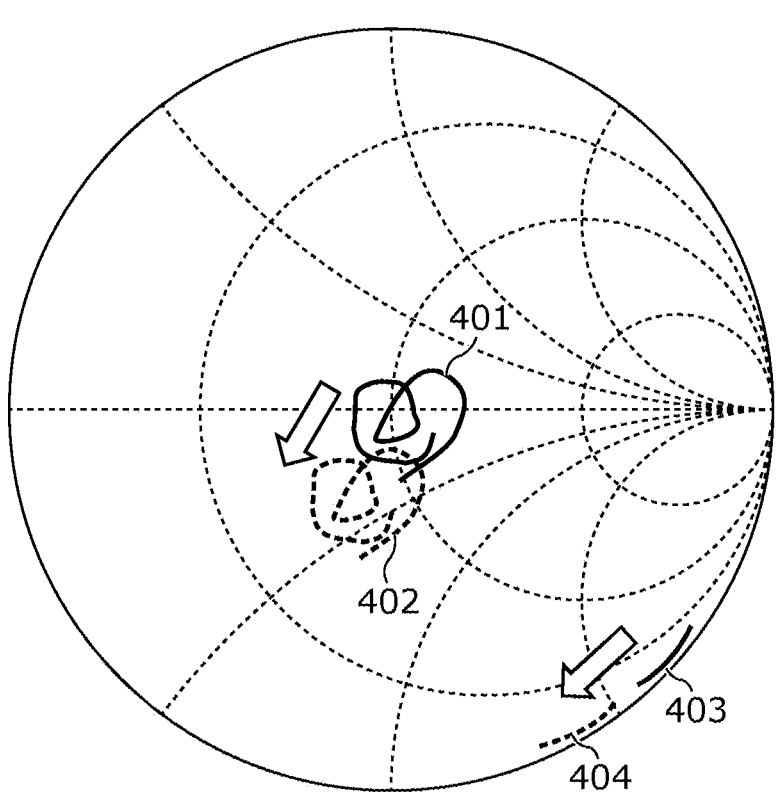
FIG. 10 is a Smith chart for illustrating the effect on parasitic capacitance caused by a shield.

The effects on parasitic capacitance caused by the shield 12 are described with reference to FIG. 10. FIG. 10 is a Smith chart for illustrating the effects on parasitic capacitance caused by the shield 12. In FIG. 10, an impedance 401 indicates impedance of a reception band of the band A (a pass band of the acoustic wave filter 100) assuming the acoustic wave filter 100 including no shield 12 is viewed from the antenna connection terminal 201. An impedance 402 indicates impedance of a reception band of the band A assuming the acoustic wave filter 100 including the shield 12 is viewed from the antenna connection terminal 201. An impedance 403 indicates impedance of a reception band of a band B simultaneously capable of communicating with the band A assuming the acoustic wave filter 100 including no shield 12 is viewed from the antenna connection terminal 201. An impedance 404 indicates impedance of a reception band of the band B assuming the acoustic wave filter 100 including the shield 12 is viewed from the antenna connection terminal 201.

The acoustic wave filter 100 including the shield 12 causes parasitic capacitance between the wire and the resonator and the shield 12, and thus, the impedance 401 shifts to the impedance 402. For impedance matching of the impedance 402, the inductance value of the inductor 200 is to be reduced, and thus a loss in the pass band increases.

In the present embodiment, a case where the inductor 200 is connected between the ground and the path connecting the antenna connection terminal 201 and the acoustic wave filter 100 is described, but the same applies to the case where the inductor 200 is connected between the antenna connection terminal 201 and the acoustic wave filter 100. More specifically, with an increase of parasitic capacitance in the acoustic wave filter 100, the inductance value of the inductor 200 is to be increased, and a loss in the pass band increases.

In addition, assuming the impedance 403 shifts to the impedance 404, a signal of the band B simultaneously capable of communicating with the band A is more likely to leak to the path of the acoustic wave filter 100, and thus isolation deteriorates. Thus, from a view point of parasitic capacitance, an area in the acoustic wave filter 100 covered with the shield 12 is preferably smaller.

However, assuming the acoustic wave filter 100 includes no shield 12, capacitive coupling and/or inductive coupling may occur between, for example, the inductor 200 and the acoustic wave filter 100, and the attenuation characteristic of the acoustic wave filter 100 deteriorates. Thus, from a view point of capacitive coupling and/or inductive coupling, an area in the acoustic wave filter 100 covered with the shield 12 is preferably larger.

1.6 Summarization

As described above, the acoustic wave filter 100 according to the present embodiment includes the piezoelectric substrate 11*a*, the series-arm resonators 101 and 103 disposed at the piezoelectric substrate 11*a*, the external connection terminal 121 disposed at the piezoelectric substrate 11*a* and connected to the antenna connection terminal 201, the external connection terminal 122 disposed at the piezoelectric substrate 11*a* and connected to an amplifier, the wire 13 disposed at the piezoelectric substrate 11*a* and electrically connecting the external connection terminal 121 to the series-arm resonator 101, the wire 14 disposed at the piezoelectric substrate 11*a* and electrically connecting the external connection terminal 122 to the series-arm resonator 103, and the shield 12 that covers a part of a side surface of the piezoelectric substrate 11*a*, wherein the shield 12 covers at least a part of an area A2 of the side surface of the piezoelectric substrate 11*a* opposing the wire 14 without covering an area A1 of the side surface of the piezoelectric substrate 11*a* opposing the wire 13.

In this structure, at least a part of the area A2 opposing the wire 14 is covered with the shield 12, and thus, coupling between another component (for example, the inductor 200) and the wire 14 can be reduced, and deterioration of an attenuation characteristic can be reduced. Particularly, assuming the inductor 200 and the wire 14 are coupled, a large part of the acoustic wave filter 100 is skipped, and attenuation largely decreases. Thus, deterioration of the attenuation characteristic is highly effectively reduced by the shield 12 covering the area A2. In contrast, the area A1 opposing the wire 13 is not covered with the shield 12. Thus, parasitic capacitance that occurs between the shield 12 and the wire 13 can be further reduced than in the case where the entirety of the side surface of the piezoelectric substrate 11*a* is covered with the shield 12. Thus, the decrease of the inductance value of the inductor 200 for impedance matching can be reduced, and an increase of a loss can be reduced. Regardless of assuming the inductor 200 and the wire 13 are coupled, attenuation can be obtained by a resonator between the wire 13 and the external connection terminal 122, and thus the effect on deterioration of the attenuation characteristic is small. As described above, in the acoustic wave filter 100, assuming the shield 12 is effectively disposed at the side surface of the piezoelectric substrate 11*a*, deterioration of the transmission characteristic and the attenuation characteristic can be reduced.

For example, in the acoustic wave filter 100 according to the present embodiment, the shield 12 does not have to cover the area A3 of the side surface of the piezoelectric substrate 11*a* opposing the series-arm resonator 101.

In this structure, the shield 12 does not cover the area A3 opposing the series-arm resonator 101. Thus, parasitic capacitance that occurs between the shield 12 and the series-arm resonator 101 can be further reduced than in the case where the entirety of the side surface of the piezoelectric substrate 11*a* is covered with the shield 12. This structure can thus reduce a decrease of the inductance value of the inductor 200 for impedance matching, and can reduce an increase of a loss. Regardless of assuming the inductor 200 and the series-arm resonator 101 are coupled, attenuation can be obtained to some extent between the series-arm resonator 101 and the external connection terminal 122, and the effect on deterioration of the attenuation characteristic is low.

For example, in the acoustic wave filter 100 according to the present embodiment, the shield 12 may cover at least a part of the area A4 of the side surface of the piezoelectric substrate 11*a* opposing the series-arm resonator 103.

In this structure, the shield 12 covers at least a part of the area A4 opposing the series-arm resonator 103. This structure can thus reduce coupling between another component (for example, the inductor 200) and the series-arm resonator 103, and can reduce deterioration of the attenuation characteristic. Particularly, assuming the inductor 200 and the series-arm resonator 103 are coupled, a large part of the acoustic wave filter 100 is skipped, and attenuation largely decreases. Thus, deterioration of the attenuation characteristic is highly effectively reduced by the shield 12 covering the area A4. Deterioration of the attenuation characteristic is highly effectively reduced by the shield 12 covering the area A4.

For example, the acoustic wave filter 100 according to the present embodiment may further include the support substrate 11*b*, the piezoelectric substrate 11*a* may be disposed on the support substrate 11*b*, the shield 12 may cover at least a part of an area A6 of a side surface of the support substrate 11*b* opposing the wire 14 without covering an area A5 of the side surface of the support substrate 11*b* opposing the wire 13.

In this structure, the shield 12 covers at least a part of the area A6 opposing the wire 14. This structure can thus reduce coupling between another component (for example, the inductor 200) and the wire 14, and can reduce deterioration of the attenuation characteristic. Particularly, assuming the inductor 200 and the wire 14 are coupled, a large part of the acoustic wave filter 100 is skipped, and attenuation largely decreases. Thus, deterioration of the attenuation characteristic is highly effectively reduced by the shield 12 covering the area A6. Deterioration of the attenuation characteristic is highly effectively reduced by the shield 12 covering the area A6. However, the area A5 opposing the wire 13 is not covered with the shield 12. Thus, parasitic capacitance that occurs between the shield 12 and the wire 13 can be further reduced than in the case where the entirety of the side surface of the piezoelectric substrate 11*a* is covered with the shield 12. Thus, the decrease of the inductance value of the inductor 200 for impedance matching can be reduced, and an increase of a loss can be reduced. Regardless of assuming the inductor 200 and the wire 13 are coupled, attenuation can be obtained between the wire 13 and the external connection terminal 122, and thus the effect on deterioration of the attenuation characteristic is low. As described above, in the acoustic wave filter 100, deterioration of the transmission characteristic and the attenuation characteristic can be reduced.

For example, in the acoustic wave filter 100 according to the present embodiment, the shield 12 does not have to cover an area A7 of the side surface of the support substrate 11*b* opposing the series-arm resonator 101.

In this structure, the area A7 opposing the series-arm resonator 101 is not covered with the shield 12. Thus, parasitic capacitance that occurs between the shield 12 and the series-arm resonator 101 can be further reduced than in the case where the entirety of the side surface of the piezoelectric substrate 11*a* is covered with the shield 12. Thus, the decrease of the inductance value of the inductor 200 for impedance matching can be reduced, and an increase of a loss can be reduced. Regardless of assuming the inductor 200 and the series-arm resonator 101 are coupled, attenuation can be obtained to some extent between the series-arm resonator 101 and the external connection terminal 122, and the effect on deterioration of the attenuation characteristic is low.

For example, in the acoustic wave filter 100 according to the present embodiment, the shield 12 may cover at least a part of an area A8 of the side surface of the support substrate 11*b* opposing the series-arm resonator 103.

In this structure, the shield 12 covers at least a part of the area A8 opposing the series-arm resonator 103. This structure can thus reduce coupling between another component (for example, the inductor 200) and the series-arm resonator 103, and can reduce deterioration of the attenuation characteristic. Particularly, assuming the inductor 200 and the series-arm resonator 103 are coupled, a large part of the acoustic wave filter 100 is skipped, and attenuation largely decreases. Thus, deterioration of the attenuation characteristic is highly effectively reduced by the shield 12 covering the area A8. Deterioration of the attenuation characteristic is highly effectively reduced by the shield 12 covering the area A8.

For example, the acoustic wave filter 100 according to the present embodiment may include a pass band including a reception band of the band A, and the amplifier may be a low-noise amplifier.

In this structure, the acoustic wave filter 100 is usable as a reception filter.

For example, the acoustic wave filter 100 according to the present embodiment may include a pass band including a transmission band of the band A, and the amplifier may be a power amplifier.

In this structure, the acoustic wave filter 100 is usable as a transmission filter.

For example, the acoustic wave filter 100 according to the present embodiment may be a surface acoustic wave filter or a bulk acoustic wave filter.

In this structure, the above effects can be obtained with a surface acoustic wave filter or a bulk acoustic wave filter.

The radio frequency module 300 according to the present embodiment includes the module substrate 301, the acoustic wave filter 100 disposed at the module substrate 301, and the inductor 200 disposed at the module substrate 301 and electrically connected to the external connection terminal 121 of the acoustic wave filter 100.

In this structure, in the radio frequency module 300 in which the inductor 200 is connected to the acoustic wave filter 100, the effects of the acoustic wave filter 100 can be implemented.

For example, in the radio frequency module 300 according to the present embodiment, the inductor 200 may be located closer to the area A1 than to the area A2.

In this structure, a distance between the inductor 200 and the wire 14 can be longer than a distance between the inductor 200 and the wire 13, and coupling between the inductor 200 and the wire 14 can be further reduced.

Second Embodiment

A second embodiment is described now. The present embodiment mainly differs from the first embodiment in that an acoustic wave filter is divided into pieces and mounted on different substrates. Hereafter, the present embodiment is described with reference to the drawings mainly on the point different from the first embodiment.

Figure 11:
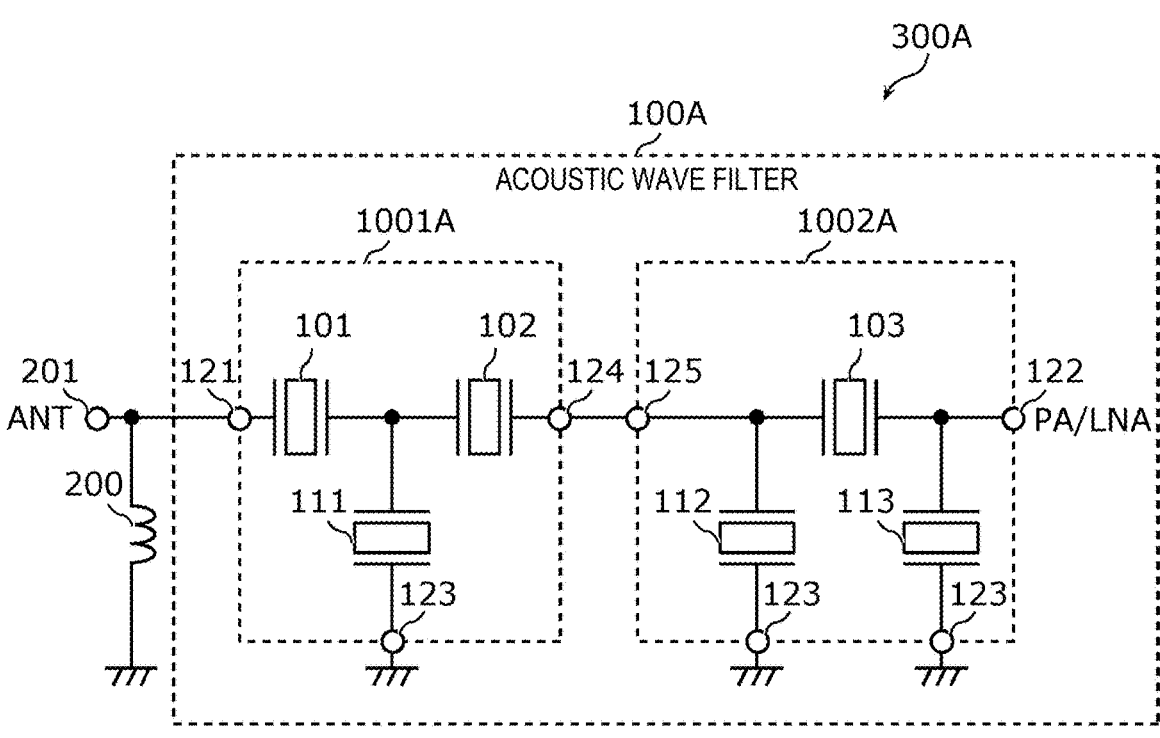
FIG. 11 is a circuit configuration diagram of a radio frequency module according to a second embodiment.

2.1 Circuit Configuration of Radio Frequency Module 300A and Acoustic Wave Filter 100A FIG. 11 is a circuit configuration diagram of a radio frequency module 300A according to the present embodiment. FIG. 11 illustrates an exemplary circuit configuration, and the radio frequency module 300A and an acoustic wave filter 100A may be implemented with any type of various circuit implementation and circuit technologies. Thus, the description of the radio frequency module 300A and the acoustic wave filter 100A provided below is not to be construed as being limiting.

The radio frequency module 300A includes the acoustic wave filter 100A, the inductor 200, and the antenna connection terminal 201.

As in the case of the acoustic wave filter 100 according to the first embodiment, the acoustic wave filter 100A is a band pass filter having a pass band including a reception band of a band A. The acoustic wave filter 100A includes series-arm resonators 101, 102, and 103, parallel-arm resonators 111, 112, and 113, and external connection terminals 121, 122, and 123. The acoustic wave filter 100A is divided into two filter modules 1001A and 1002A and implemented.

The filter module 1001A includes the series-arm resonators 101 and 102, the parallel-arm resonator 111, and the external connection terminals 121, 123, and 124.

The external connection terminal 124 is an example of a third external connection terminal, is connected to an external connection terminal 125 of the filter module 1002A outside the filter module 1001A, and is connected to the series-arm resonator 102 in the filter module 1001A.

The filter module 1002A includes the series-arm resonator 103, the parallel-arm resonators 112 and 113, and the external connection terminals 122, 123, and 125.

The external connection terminal 125 is an example of a fourth external connection terminal, is connected to the external connection terminal 124 of the filter module 1001A outside the filter module 1002A, and is connected to the series-arm resonator 103 in the filter module 1002A.

2.2 Implementation Example of Acoustic Wave Filter 100A

Figure 12:
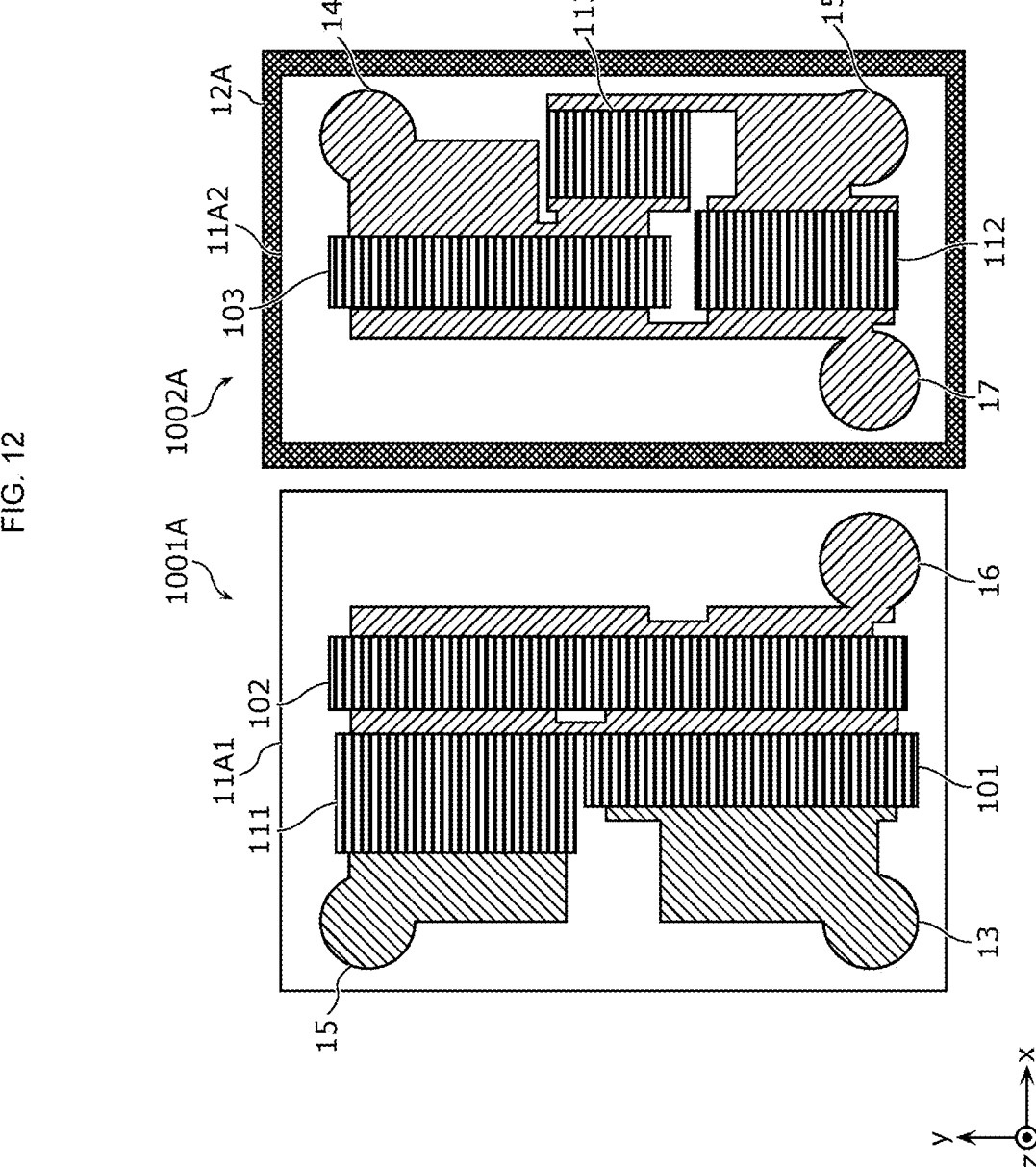
FIG. 12 is a cross-sectional view of a filter module according to the second embodiment.

An implementation example of the acoustic wave filter 100A is described now with reference to FIG. 12. FIG. 12 is a cross-sectional view of the filter modules 1001A and 1002A according to the present embodiment. FIG. 12 is an exemplary diagram, and the acoustic wave filter 100A may be implemented with any type of various circuit implementation and circuit technologies. Thus, the description of the filter modules 1001A and 1002A provided below is not to be construed as being limiting.

The filter module 1001A includes a substrate 11A1 serving as an example of a first substrate. The series-arm resonators 101 and 102, the parallel-arm resonator 111, and wires 13, 15, and 16 are disposed at the substrate 11A1. The wire 16 electrically connects the series-arm resonator 102 to the external connection terminal 124. The side surface of the substrate 11A1 is not covered with a shield.

The filter module 1002A includes a substrate 11A2 serving as a second substrate. The series-arm resonator 103, the parallel-arm resonators 112 and 113, and wires 14, 15, and 17 are disposed at the substrate 11A2. The side surface of the substrate 11A2 is covered with a shield 12A. The wire 17 electrically connects the series-arm resonator 103 to the external connection terminal 125. In the present embodiment, the entirety of the side surface of the substrate 11A2 is covered with the shield 12A. Instead, a part of the side surface of the substrate 11A2 may be left without being covered with the shield 12A.

The number of series-arm resonators and the number of parallel-arm resonators included in each of the filter modules 1001A and 1002A are not limited to the numbers of resonators illustrated in FIG. 11.

2.3 Summarization

As described above, the acoustic wave filter 100A according to the present embodiment includes the substrates 11A1 and 11A2, the series-arm resonator 101 disposed at the substrate 11A1, the series-arm resonator 103 disposed at the substrate 11A2, the external connection terminal 121 disposed at the substrate 11A1 and connected to the antenna connection terminal 201, the external connection terminal 122 disposed at the substrate 11A2 and connected to an amplifier, the external connection terminal 124 disposed at the substrate 11A1 and connected to the substrate 11A2, the external connection terminal 125 disposed at the substrate 11A2 and connected to the external connection terminal 124, and the shield 12A that covers at least a part of a side surface of the substrate 11A2, wherein a side surface of the substrate 11A1 is not covered with the shield.

In this structure, to cover or not to cover the side surface can be changed for each substrate. Thus, the process of manufacturing the acoustic wave filter 100A can be simplified.

Third Embodiment

A third embodiment is described now. The present embodiment mainly differs from the second embodiment in that a radio frequency module includes two acoustic wave filters having different pass bands. Hereafter, the present embodiment is described with reference to the drawings mainly on the point different from the second embodiment.
3.1 Circuit Configuration of Radio Frequency Module 300B and Acoustic Wave Filter 100B

Figure 13:
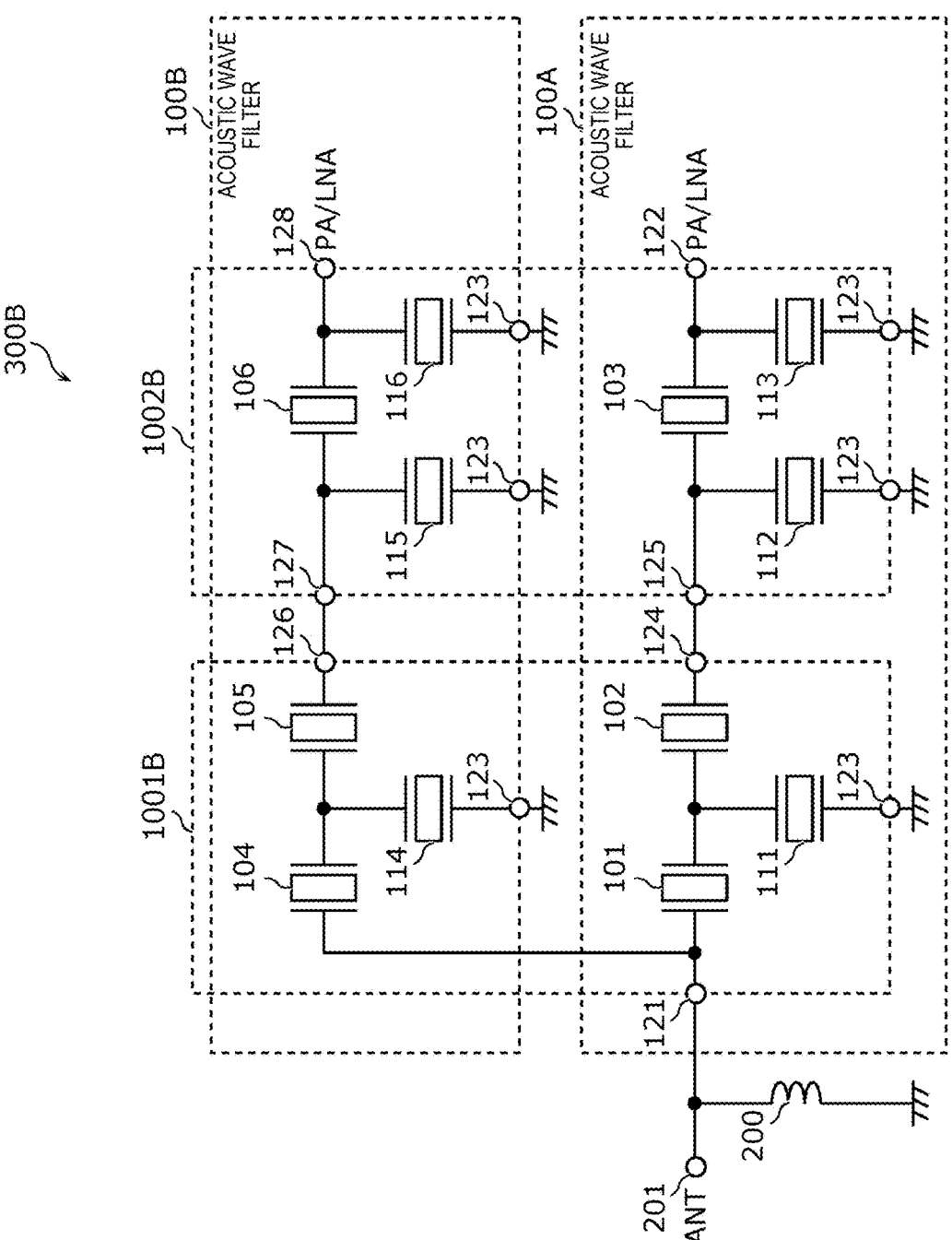
FIG. 13 is a circuit configuration diagram of a radio frequency module according to a third embodiment.

FIG. 13 is a circuit configuration diagram of a radio frequency module 300B according to the present embodiment. FIG. 13 illustrates an exemplary circuit configuration, and the radio frequency module 300B and acoustic wave filters 100A and 100B may be implemented with any type of various circuit implementation and circuit technologies. Thus, the description of the radio frequency module 300B and the acoustic wave filters 100A and 100B provided below is not to be construed as being limiting.

The radio frequency module 300B includes the acoustic wave filters 100A and 100B, the inductor 200, and the antenna connection terminal 201.

The acoustic wave filter 100B is a band pass filter having a pass band including a reception band of the band B simultaneously capable of communicating with the band A. The acoustic wave filter 100B may be a band pass filter having a pass band including a transmission band of the band B. The acoustic wave filter 100B is not limited to a band pass filter. The band B is an example of a second band, a frequency band for a communication system built with a RAT as in the band A, and defined in advance by, for example, a standardization organization.

The acoustic wave filter 100B includes series-arm resonators 104, 105, and 106, parallel-arm resonators 114, 115, and 116, and external connection terminals 123 and 128.

The external connection terminal 128 is connected to a power amplifier (not illustrated) and/or a low-noise amplifier (not illustrated) outside the acoustic wave filter 100B, and connected to the series-arm resonator 106 in the acoustic wave filter 100B.

The series-arm resonators 104 to 106 are connected in series between the external connection terminals 121 and 128. More specifically, the series-arm resonator 104 is connected between the external connection terminal 121 and the series-arm resonator 105. The series-arm resonator 105 is connected between the series-arm resonators 104 and 106. The series-arm resonator 106 is connected between the series-arm resonator 105 and the external connection terminal 128.

The parallel-arm resonators 114 to 116 are connected in parallel between the ground and a path connecting the external connection terminals 121 and 128. More specifically, the parallel-arm resonator 114 is connected between the path connecting the series-arm resonators 104 and 105 and a corresponding one of the external connection terminals 123. The parallel-arm resonator 115 is connected between the path connecting the series-arm resonators 105 and 106 and a corresponding one of the external connection terminals 123. The parallel-arm resonator 116 is connected between the path connecting the series-arm resonator 106 and the external connection terminal 128 and a corresponding one of the external connection terminals 123.

A part of the acoustic wave filter 100A and a part of the acoustic wave filter 100B are mounted on a filter module 1001B, and another part of the acoustic wave filter 100A and another part of the acoustic wave filter 100B are mounted on a filter module 1002B.

The filter module 1001B includes the series-arm resonators 101, 102, 104, and 105, the parallel-arm resonators 111 and 114, and the external connection terminals 121, 123, 124, and 126.

The external connection terminal 126 is connected to the external connection terminal 127 of the filter module 1002B outside the filter module 1001B, and connected to the series-arm resonator 105 in the filter module 1001B.

The filter module 1002B includes the series-arm resonators 103 and 106, the parallel-arm resonators 112, 113, 115, and 116, and the external connection terminals 122, 123, 125, 127, and 128.

The external connection terminal 127 is connected to the external connection terminal 126 of the filter module 1001B outside the filter module 1002B, and connected to the series-arm resonator 106 in the filter module 1002B.

The number of series-arm resonators and the number of parallel-arm resonators included in each of the acoustic wave filters 100A and 100B are not limited to the numbers of resonators illustrated in FIG. 13.
3.2 Implementation Examples of Acoustic Wave Filters 100A and 100B

Figure 14:
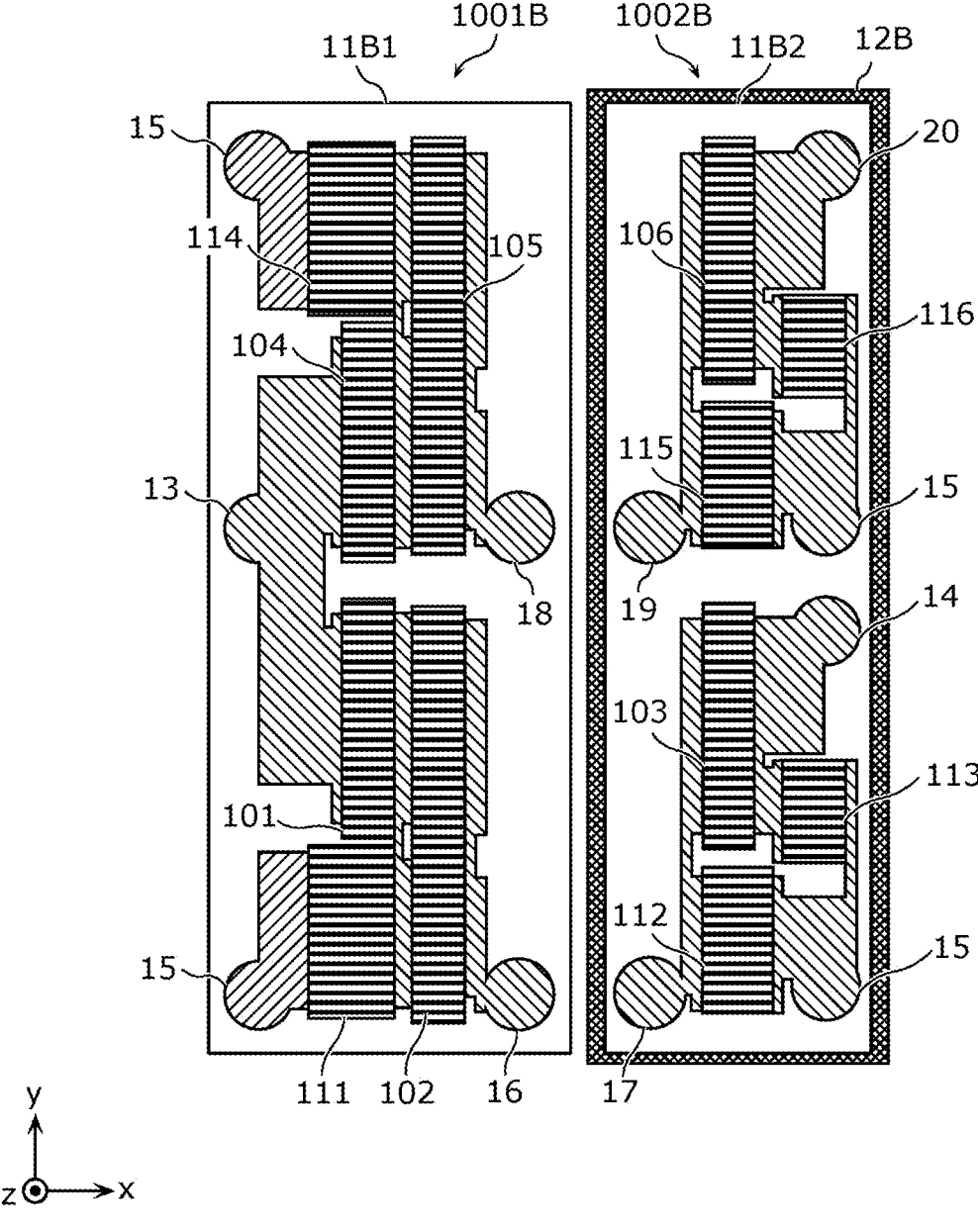
FIG. 14 is a cross-sectional view of a filter module according to the third embodiment.

Implementation examples of the acoustic wave filters 100A and 100B are now described with reference to FIG. 14. FIG. 14 is a cross-sectional view of the filter modules 1001B and 1002B according to the present embodiment. FIG. 14 is an exemplary diagram, and the acoustic wave filters 100A and 100B may be implemented with any type of various circuit implementation and circuit technologies. Thus, the description of the filter modules 1001B and 1002B provided below is not to be construed as being limiting.

The filter module 1001B includes a substrate 11B1 serving as an example of a first substrate. The series-arm resonators 101, 102, 104, and 105, the parallel-arm resonators 111 and 114, and the wires 13, 15, 16, and 18 are disposed at the substrate 11B1. The wire 13 electrically connects the series-arm resonators 101 and 104 to the external connection terminal 121. The wire 18 electrically connects the series-arm resonator 105 to the external connection terminal 126. The side surface of the substrate 11B1 is not covered with a shield.

The filter module 1002B includes a substrate 11B2 serving as an example of a second substrate. The series-arm resonator 103, the parallel-arm resonators 112 and 113, and the wires 14, 15, 17, 19, and 20 are disposed at the substrate 11B2. The wire 19 electrically connects the series-arm resonator 106 to the external connection terminal 127. The wire 20 electrically connects the series-arm resonator 106 to the external connection terminal 128. The side surface of the substrate 11B2 is covered with a shield 12B. In the present embodiment, the entirety of the side surface of the substrate 11B2 is covered with the shield 12B. Instead, a part of the side surface of the substrate 11B2 may be left without being covered with the shield 12B.

The number of series-arm resonators and the number of parallel-arm resonators included in the filter module 1001B and the filter module 1002B are not limited to the numbers of resonators illustrated in FIG. 14.

Other Embodiments

Although an acoustic wave filter and a radio frequency module according to embodiments of the present disclosure have been described above, an acoustic wave filter and a radio frequency module according to the present disclosure are not limited to those according to the above embodiments. The present disclosure also includes other embodiments implemented by combining any components according to the above embodiments, modification examples obtained by providing, to the above embodiments, various modifications that persons having ordinary skill in the art think of within a range not departing from the gist of the present disclosure, and various devices including the above acoustic wave filter or the above radio frequency module.

For example, in a circuit configuration of each of various circuits according to the embodiments, components such as another circuit element and a wire may be inserted between a path connecting a signal path and each circuit element disclosed in the drawings.

The features of the acoustic wave filter and the radio frequency module according to each of the above embodiments are described below.

<1> An acoustic wave filter, comprising:

a first substrate;

a first series-arm resonator and a second series-arm resonator disposed at the first substrate;

a first external connection terminal disposed at the first substrate and connected to an antenna connection terminal;

a second external connection terminal disposed at the first substrate and connected to an amplifier;

a first wire disposed at the first substrate and electrically connecting the first external connection terminal to the first series-arm resonator;

a second wire disposed at the first substrate and electrically connecting the second external connection terminal to the second series-arm resonator; and a shield covering a part of a side surface of the first substrate, wherein the shield covers at least a part of a second area of the side surface of the first substrate opposing the second wire without covering a first area of the side surface of the first substrate opposing the first wire.

<2> The acoustic wave filter according to <1>, wherein the shield does not cover a third area of the side surface of the first substrate opposing the first series-arm resonator.

<3> The acoustic wave filter according to <1> or <2>, wherein the shield covers at least a part of a fourth area of the side surface of the first substrate opposing the second series-arm resonator.

<4> The acoustic wave filter according to any one of <1> to <3>, further comprising:

a second substrate, wherein the first substrate is disposed on the second substrate, and wherein the shield covers at least a part of a sixth area of a side surface of the second substrate opposing the second wire without covering a fifth area of the side surface of the second substrate opposing the first wire.

<5> The acoustic wave filter according to <4>, wherein the shield does not cover a seventh area of the side surface of the second substrate opposing the first series-arm resonator.

<6> The acoustic wave filter according to <4> or <5>, wherein the shield covers at least a part of an eighth area of the side surface of the second substrate opposing the second series-arm resonator.

<7> The acoustic wave filter according to any one of <1> to <6>, wherein the acoustic wave filter has a pass band including a reception band of a first band, and wherein the amplifier is a low-noise amplifier.

<8> The acoustic wave filter according to any one of <1> to <6>, wherein the acoustic wave filter has a pass band including a transmission band of a first band, and wherein the amplifier is a power amplifier.

<9> The acoustic wave filter according to any one of <1> to <8>, wherein the acoustic wave filter is a surface acoustic wave filter or a bulk acoustic wave filter.

<10> A radio frequency module, comprising:

a module substrate;

the acoustic wave filter according to any one of <1> to <9> disposed at the module substrate; and an inductor disposed at the module substrate, and electrically connected to the first external connection terminal of the acoustic wave filter.

<11> The radio frequency module according to <10>, wherein the inductor is located closer to the first area than to the second area.

<12> An acoustic wave filter, comprising:

a first substrate and a second substrate;

a first series-arm resonator disposed at the first substrate;

a second series-arm resonator disposed at the second substrate;

a first external connection terminal disposed at the first substrate and connected to an antenna connection terminal;

a second external connection terminal disposed at the second substrate and connected to an amplifier;

a third external connection terminal disposed at the first substrate and connected to the second substrate;

a fourth external connection terminal disposed at the second substrate and connected to the third external connection terminal; and a shield that covers at least a part of a side surface of the second substrate, wherein a side surface of the first substrate is not covered with the shield.

The present disclosure is widely usable, as a radio frequency module disposed at a front end portion, in a communication device such as a mobile phone.

What is claimed is:

1. An acoustic wave filter, comprising:

a first substrate;

a first series-arm resonator and a second series-arm resonator disposed at the first substrate;

a first external connection terminal disposed at the first substrate and connected to an antenna connection terminal;

a second external connection terminal disposed at the first substrate and connected to an amplifier;

a first wire disposed at the first substrate and electrically connecting the first external connection terminal to the first series-arm resonator;

a second wire disposed at the first substrate and electrically connecting the second external connection terminal to the second series-arm resonator; and a shield covering a part of a side surface of the first substrate, wherein the shield covers at least a part of a second area of the side surface of the first substrate opposing the second wire without covering a first area of the side surface of the first substrate opposing the first wire.

2. The acoustic wave filter according to claim 1, wherein the shield does not cover a third area of the side surface of the first substrate opposing the first series-arm resonator.

3. The acoustic wave filter according to claim 2, wherein the shield covers at least a part of a fourth area of the side surface of the first substrate opposing the second series-arm resonator.

4. The acoustic wave filter according to claim 2, further comprising:

a second substrate, wherein the first substrate is disposed on the second substrate, and wherein the shield covers at least a part of a sixth area of a side surface of the second substrate opposing the second wire without covering a fifth area of the side surface of the second substrate opposing the first wire.

5. The acoustic wave filter according to claim 4, wherein the shield does not cover a seventh area of the side surface of the second substrate opposing the first series-arm resonator.

6. The acoustic wave filter according to claim 4, wherein the shield covers at least a part of an eighth area of the side surface of the second substrate opposing the second series-arm resonator.

7. The acoustic wave filter according to claim 2, wherein the acoustic wave filter has a pass band including a reception band of a first band, and wherein the amplifier is a low-noise amplifier.

8. The acoustic wave filter according to claim 2, wherein the acoustic wave filter has a pass band including a transmission band of a first band, and wherein the amplifier is a power amplifier.

9. The acoustic wave filter according to claim 2, wherein the acoustic wave filter is a surface acoustic wave filter or a bulk acoustic wave filter.

10. A radio frequency module, comprising:

a module substrate;

the acoustic wave filter according to claim 2 disposed at the module substrate; and an inductor disposed at the module substrate, and electrically connected to the first external connection terminal of the acoustic wave filter.

11. The radio frequency module according to claim 10, wherein the inductor is located closer to the first area than to the second area.

12. An acoustic wave filter, comprising:

a first substrate and a second substrate;

a first series-arm resonator disposed at the first substrate;

a second series-arm resonator disposed at the second substrate;

a first external connection terminal disposed at the first substrate and connected to an antenna connection terminal;

a second external connection terminal disposed at the second substrate and connected to an amplifier;

a third external connection terminal disposed at the first substrate and connected to the second substrate;

a fourth external connection terminal disposed at the second substrate and connected to the third external connection terminal; and a shield that covers at least a part of a side surface of the second substrate, wherein a side surface of the first substrate is not covered with the shield.

13. The acoustic wave filter according to claim 1, wherein the shield covers at least a part of a fourth area of the side surface of the first substrate opposing the second series-arm resonator.

14. The acoustic wave filter according to claim 1, further comprising:

a second substrate, wherein the first substrate is disposed on the second substrate, and wherein the shield covers at least a part of a sixth area of a side surface of the second substrate opposing the second wire without covering a fifth area of the side surface of the second substrate opposing the first wire.

15. The acoustic wave filter according to claim 14, wherein the shield does not cover a seventh area of the side surface of the second substrate opposing the first series-arm resonator.

16. The acoustic wave filter according to claim 14, wherein the shield covers at least a part of an eighth area of the side surface of the second substrate opposing the second series-arm resonator.

17. The acoustic wave filter according to claim 1, wherein the acoustic wave filter has a pass band including a reception band of a first band, and wherein the amplifier is a low-noise amplifier.

18. The acoustic wave filter according to claim 1, wherein the acoustic wave filter has a pass band including a transmission band of a first band, and wherein the amplifier is a power amplifier.

19. The acoustic wave filter according to claim 1, wherein the acoustic wave filter is a surface acoustic wave filter or a bulk acoustic wave filter.

20. A radio frequency module, comprising:

a module substrate;

the acoustic wave filter according to claim 1 disposed at the module substrate; and an inductor disposed at the module substrate, and electrically connected to the first external connection terminal of the acoustic wave filter.

* * * * *